(12) United States Patent  
Van Greevenbroek (10) Patent No.: US 8,441,611 B2  
(45) Date of Patent: May 14, 2013

(54) LITHOGRAPHIC APPARATUS AND METHOD (75) Inventor: Hendrikus Robertus Marie Van Greevenbroek, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 645 days.

(21) Appl. No.: 12/292,767

(22) Filed: Nov. 25, 2008

(65) Prior Publication Data  
US 2009/0135394 A1 May 28, 2009

(51) Int. Cl.  
G03B 27/54 (2006.01)  
G03B 27/32 (2006.01)

(52) U.S. Cl.  
USPC .............................. 355/67; 355/77

(58) Field of Classification Search .......... 355/67  
See application file for complete search history.

(56) References Cited

U.S. PATENT DOCUMENTS

| | | | |
|---|---|---|---|
| 5,667,918 A * | 9/1997 | Brainerd et al. ........ | 430/5 |
| 6,771,352 B2 * | 8/2004 | Dierichs ............. | 355/71 |
| 7,030,958 B2 | 4/2006 | Luijkx et al. | |
| 7,088,527 B2 * | 8/2006 | Wiener ............. | 359/738 |
| 7,170,587 B2 * | 1/2007 | Dierichs et al. ......... | 355/71 |
| 7,362,413 B2 | 4/2008 | Kremer et al. | |
| 7,532,308 B2 | 5/2009 | Bouman | |
| 2002/0048007 A1 * | 4/2002 | Tsuji et al. ........ | 355/66 |
| 2005/0140957 A1 | 6/2005 | Luijkx et al. | |
| 2005/0275818 A1 * | 12/2005 | Singer ............. | 355/55 |
| 2006/0126036 A1 | 6/2006 | Kremer et al. | |
| 2007/0014112 A1 * | 1/2007 | Ohya et al. ........ | 362/268 |
| 2007/0058150 A1 | 3/2007 | Bouman | |
| 2007/0097345 A1 * | 5/2007 | Hult ............. | 355/69 |

FOREIGN PATENT DOCUMENTS

| | | |
|---|---|---|
| JP | 07-037774 | 2/1995 |
| JP | 2002-110529 | 4/2002 |
| JP | 2002-184676 | 6/2002 |
| JP | 2005-196180 | 7/2005 |
| JP | 2006-165581 | 6/2006 |
| JP | 2007-081397 | 3/2007 |
| JP | 2007-123888 | 5/2007 |

OTHER PUBLICATIONS

Japanese Office Action mailed Jun. 14, 2011 in corresponding Japanese Patent Application No. 2008-297415.

* cited by examiner

*Primary Examiner* — Peter B Kim  
*Assistant Examiner* — Michelle Iacoletti  
(74) *Attorney, Agent, or Firm* — Pillsbury Winthrop Shaw Pittman LLP (57) ABSTRACT

A lithographic apparatus is disclosed that is configured to project a patterned beam of radiation onto a target portion of a substrate, the lithographic apparatus including an illumination system configured to condition a beam of radiation, the illumination system having a uniformity correction system located in a plane which, in use, is illuminated with a substantially constant pupil by the illumination system.

23 Claims, 7 Drawing Sheets

LITHOGRAPHIC APPARATUS AND METHOD

This application claims priority and benefit under 35 U.S.C. §119(e) to U.S. Provisional Patent Application Ser. No. 60/996,653, entitled "LITHOGRAPHIC APPARATUS AND METHOD", filed on Nov. 28, 2007. The content of that application is incorporated herein in its entirety by reference.

FIELD

The present invention relates to a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

A lithographic apparatus typically includes an illumination system, which is arranged to condition radiation generated by a radiation source before it is incident upon the patterning device. The illumination system may, for example, modify one or more properties of the radiation such as polarization and/or illumination mode. The illumination system may include a uniformity correction system which is arranged to correct or reduce non-uniformities present in the radiation. In some instances the uniformity correction system may compromise or modify in an unwanted manner one or more properties of the radiation beam.

SUMMARY

It is desirable to provide a lithographic apparatus and method which overcomes or mitigates one or more problems, whether identified herein or elsewhere.

According to an aspect of the invention, there is provided a lithographic apparatus comprising an illumination system for conditioning a beam of radiation, a support structure for supporting a patterning device, the patterning device serving to impart the radiation beam with a pattern in its cross-section, a substrate table for holding a substrate, and a projection system for projecting the patterned radiation beam onto a target portion of the substrate, wherein the illumination system comprises a uniformity correction system located in a plane which, in use, is illuminated with a substantially constant pupil by the illumination system.

According to an aspect of the invention, there is provided a lithographic apparatus comprising an illumination system for conditioning a beam of radiation, a support structure for supporting a patterning device, the patterning device serving to impart the radiation beam with a pattern in its cross-section, a uniformity correction system for adjusting an intensity of the radiation beam, a patterning device masking blade for masking at least a portion of the radiation beam, a substrate table for holding a substrate, and a projection system for projecting the patterned radiation beam onto a target portion of the substrate, wherein the patterning device masking blade is not located in a field plane of the illumination system, and the uniformity correction system is located at or adjacent to the field plane of the illumination system.

According to an aspect of the invention, there is provided a method of lithography comprising generating a radiation beam, passing the radiation beam through an illumination system of a lithographic apparatus, directing the radiation beam onto a patterning device to pattern the radiation beam, projecting the patterned radiation beam through a projection system of the lithographic apparatus and onto a substrate, wherein an intensity of the radiation beam is adjusted by a uniformity correction system which is illuminated with a substantially constant pupil by the illumination system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1:
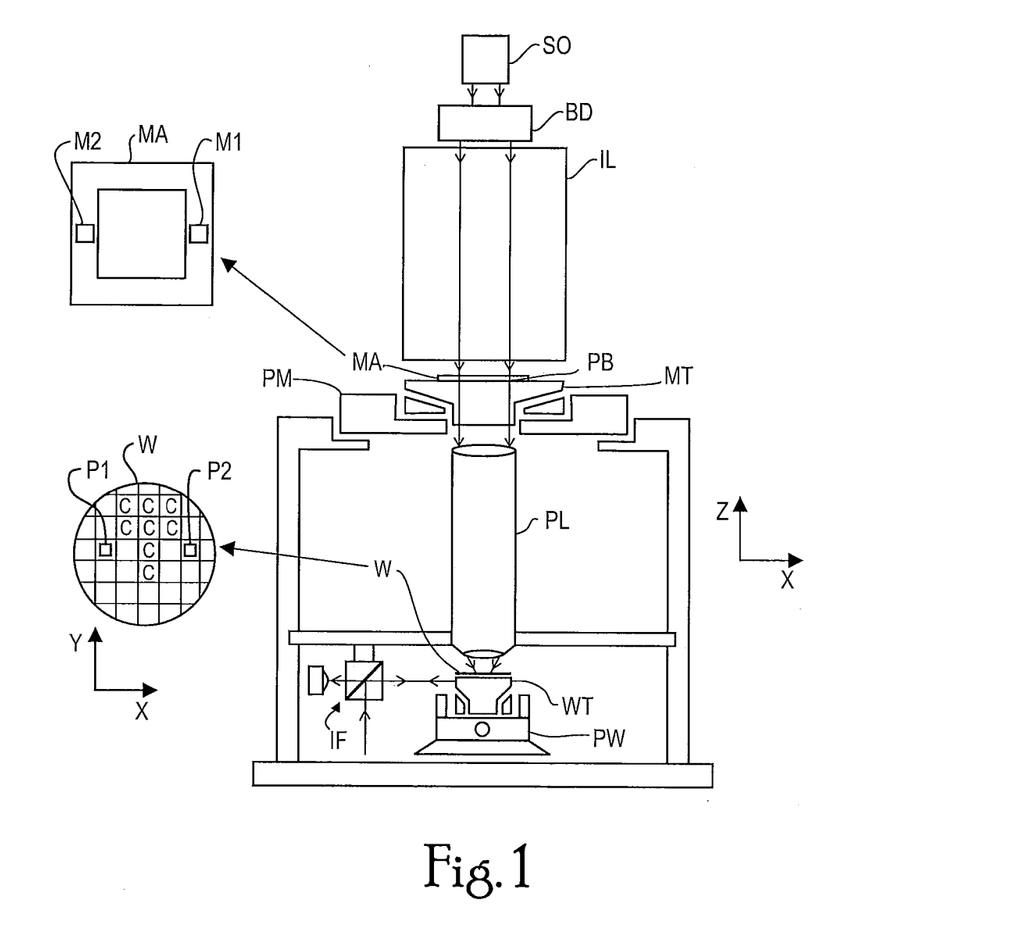
FIG. 1 depicts a lithographic apparatus to which an embodiment of the invention may be provided.

FIG. 1 schematically depicts a lithographic apparatus to which an embodiment of the invention may be applied. The apparatus comprises:

- an illumination system (illumination system) IL to condition a beam PB of radiation (e.g. UV radiation or DUV radiation);
- a support structure (e.g. a mask table) MT to support a patterning device (e.g. a mask) MA and connected to first positioning device PM to accurately position the patterning device with respect to item PL;
- a substrate table (e.g. a wafer table) WT for holding a substrate (e.g. a resist-coated wafer) W and connected to second positioning device PW for accurately positioning the substrate with respect to item PL; and
- a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The support structure MT holds the patterning device. It holds the patterning device in a way depending on the orientation of the patterning device, the design of the lithographic apparatus, and other conditions, such as for example whether or not the patterning device is held in a vacuum environment. The support structure MT can use mechanical clamping, vacuum, or other clamping techniques, for example electrostatic clamping under vacuum conditions. The support structure MT may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp. The source SO and the illumination system IL, together with the beam delivery system BD if required, may be referred to as a radiation system.

The illumination system IL may comprise adjustor configured to adjust the angular intensity distribution of the beam. Generally, at least the outer and/or inner radial extent (commonly referred to as σ-outer and σ-inner, respectively) of the intensity distribution in a pupil plane of the illumination system can be adjusted. The illumination system provides a conditioned beam of radiation PB, having a desired uniformity and intensity distribution in its cross-section.

The illumination system may also encompass various types of optical components, including refractive, reflective, and catadioptric optical components for directing, shaping, or controlling the beam of radiation, and such components may also be referred to below, collectively or singularly, as a "lens".

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion. The direction of scanning is conventionally referred to as the y-direction.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
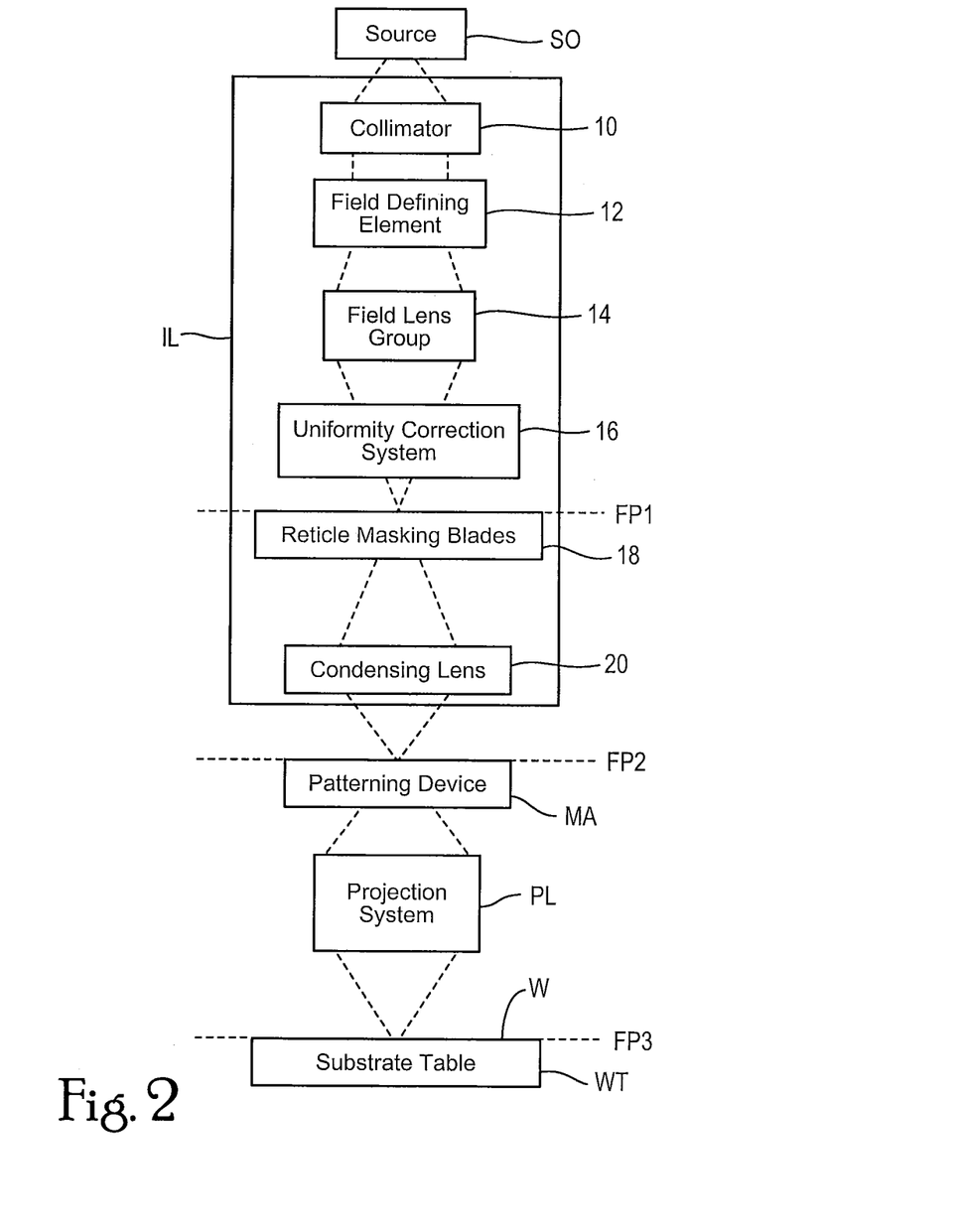
FIG. 2 depicts a lithographic apparatus.

FIG. 2 depicts a lithographic apparatus. The apparatus comprises a source SO, an illumination system IL, a support structure (not shown) holding a patterning device MA, projection system PL and substrate table WT. A substrate W is located on the substrate table WT.

The illumination system comprises a collimator 10, a field defining element 12, a field lens group 14, uniformity correction system 16, one or more patterning device (e.g., reticle) masking blades 18 and a condensing lens 20.

In use the collimator 10 collimates a radiation beam generated by the source SO (the beam is schematically indicated by dashed lines). The field defining element 12 forms the radiation beam into a field shape which will be projected onto the substrate W. The field defining element may, for example, comprise two arrays of convex lenses, the second array being placed in the focal plane of the first array.

The field lens group 14 focuses the radiation beam onto a field plane FP1. The masking blades 18, which comprise a pair of blades moveable in the scanning direction of the lithographic apparatus, are located in the field plane FP1.

The masking blades 18 are used to ensure that during exposure of a given target area radiation is not incident upon a target area which is adjacent in the y- and/or x-direction to the given target area. The masking blades 18 are located in the field plane FP1 so that masking provided by the masking blades 18 is translated accurately (and with sharp edges) onto the patterning device MA.

A uniformity correction system 16 is located before the masking blades 18 in the path of the radiation beam, so that the radiation beam passes through the uniformity correction system before it is incident upon the masking blades 18. The uniformity correction system 16 is therefore not located in the field plane FP1, but instead is displaced from it. The uniformity correction system 16 is a device which controls spatially the intensity of the field of the radiation beam. That is, it controls spatially the intensity of the radiation in the field shape which will be projected onto the substrate W.

After passing through the masking blades 18 the radiation beam is incident upon the condensing lens 20. The condensing lens 20 focuses the radiation to a further field plane FP2. The patterning device MA, which is located in this field plane FP2, applies a pattern to the radiation beam.

The patterned radiation beam passes through the projection system PL and onto the substrate W, which is located in a further field plane FP3, thereby transferring the pattern onto the substrate.

Figure 3:
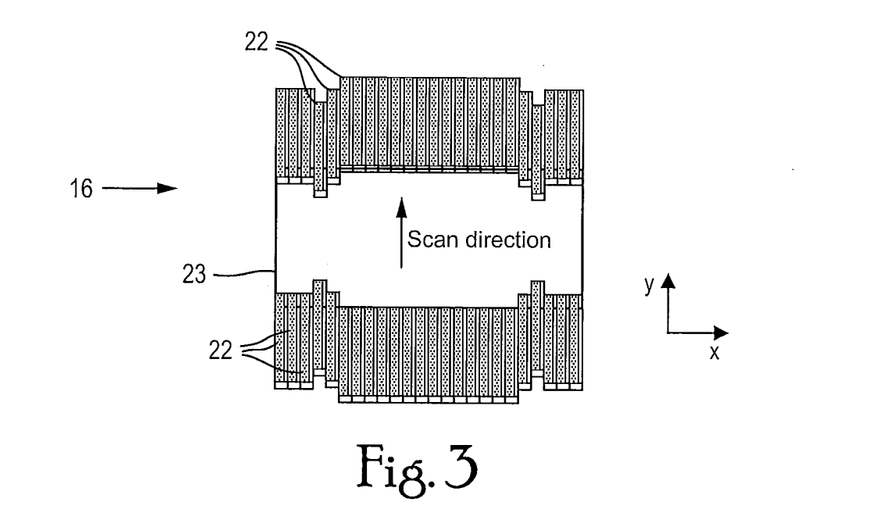
FIG. 3 depicts a uniformity correction system and patterning device masking blades of the lithographic apparatus.

FIG. 3 shows, viewed from above, the uniformity correction system 16. The uniformity correction system comprises two sets of fingers 22 which are moveable in the y-direction. The fingers 22 may be moved such that they intersect the radiation beam. In this way, the fingers may be used to block some radiation. This may be done, for example, to reduce the intensity of radiation in a location of the radiation beam field in which the radiation intensity is too high.

As mentioned above, the uniformity correction system 16 is located before, in the path of the radiation beam, the masking blades 18 (see FIG. 2) at the field plane FP1. Since the masking blades 18 are in the field plane FP1, the uniformity correction system 16 is displaced from the field plane FP1.

Figure 4:
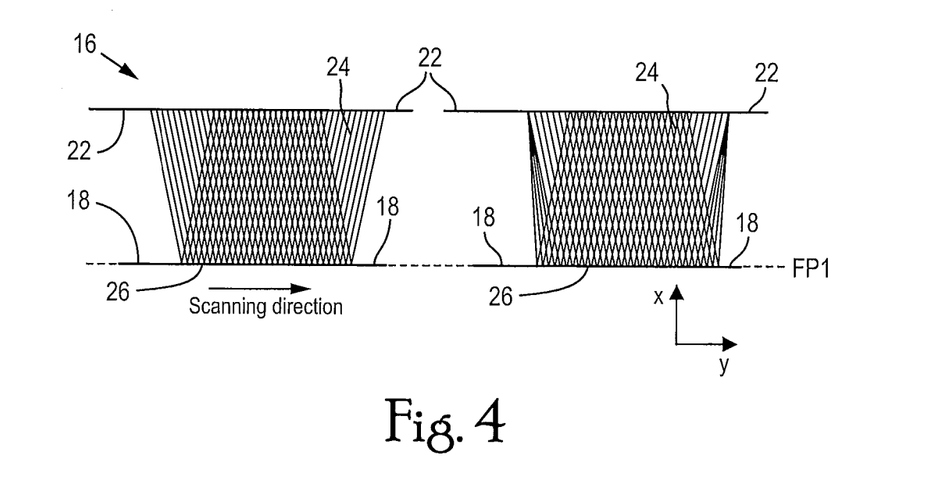
FIG. 4 shows an effect of using a uniformity correction system arranged as in FIG. 2.

FIG. 4 shows an effect of using this arrangement of the uniformity correction system 16. FIG. 4 shows schematically from one side in cross-section the uniformity correction system fingers 22, and the field plane FP1 in which the masking blades 18 are located. The radiation beam is 24 represented schematically as a plurality of sub-beams which are converging to form a plurality of virtual sources 26 in the field plane FP1.

In the left hand side of FIG. 4 the fingers 22 are retracted, that is to say they are positioned such that they do not intersect with the radiation beam 24. In the right hand side of FIG. 4 the fingers 22 have been moved in the y-direction such that they intersect with an edge of the radiation beam. The fingers 22 partially cut off some of the sub-beams of the radiation beam 24.

Since the uniformity correction system 16 is not located in the field plane FP1, the uniformity correction system introduces asymmetry into the pupil of the radiation beam, such that the beam is no longer balanced (this may mean that the beam is no longer telecentric and/or suffers from energetic ellipticity). The uniformity correction system causes a shadow to be introduced on one side of the radiation beam in the integrated pupil plane of the radiation beam. This asymmetry in the pupil of the radiation beam is undesirable, since it will reduce the accuracy with which the lithographic apparatus projects the pattern of the patterning device MA onto the substrate W.

In an embodiment of the invention, instead of placing the uniformity correction system before the field plane FP1 in the path of the radiation beam, the uniformity correction system is placed in or at the field plane FP1. An embodiment of the invention is illustrated in FIG. 5.

Figure 5:
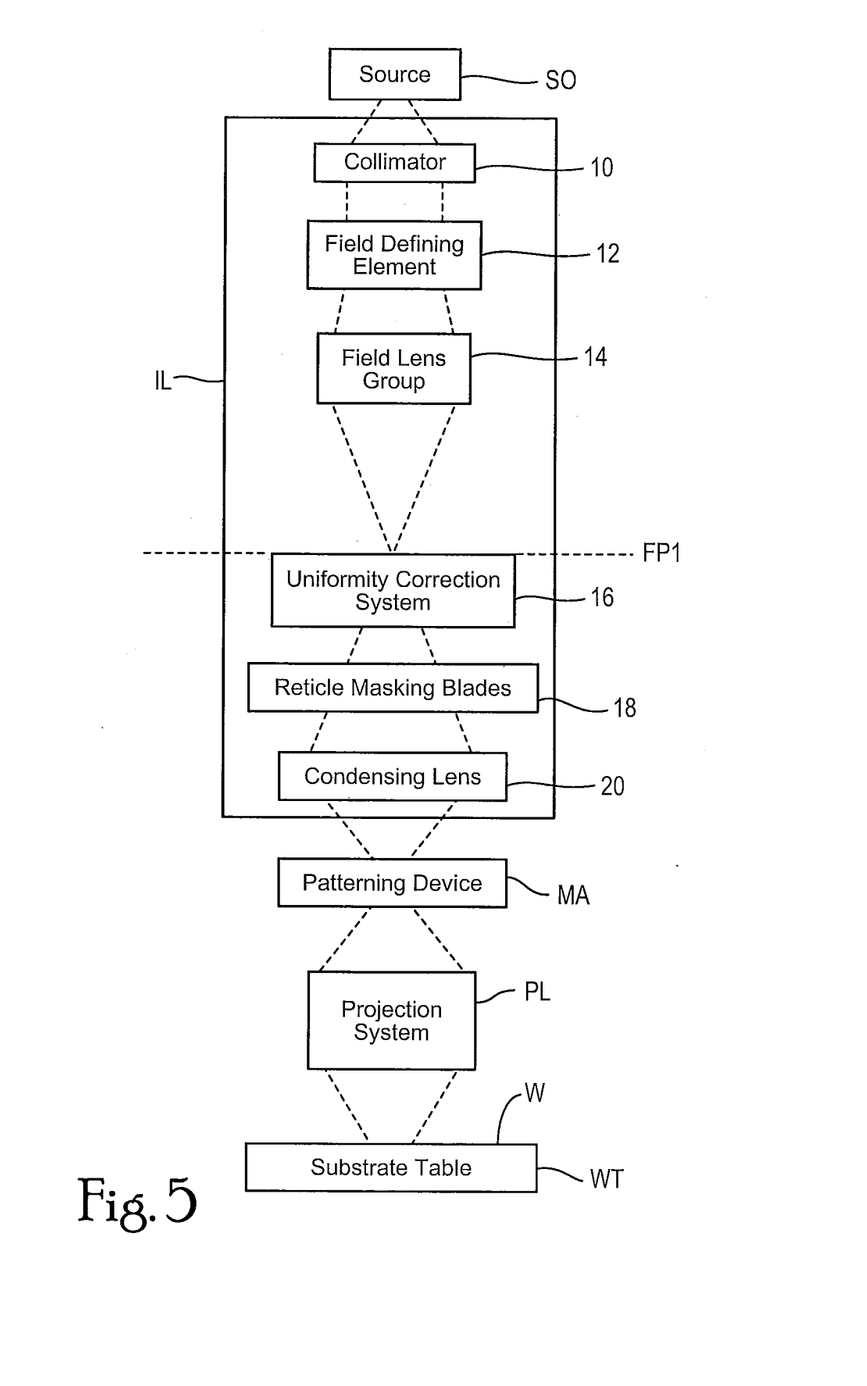
FIG. 5 depicts a lithographic apparatus according to an embodiment of the invention.

FIG. 5 depicts a lithographic apparatus according to an embodiment of the invention. The lithographic apparatus corresponds in large part with the lithographic apparatus shown in FIG. 2, and so is not described in detail here. A difference compared with the lithographic apparatus of FIG. 2 is that the uniformity correction system 16 is located at the field plane FP1 of the illumination system IL. The masking blades 18 are located after the field plane FP1, so that the radiation beam passes through the uniformity correction system 16 before it is incident upon the masking blades 18.

Figure 6:
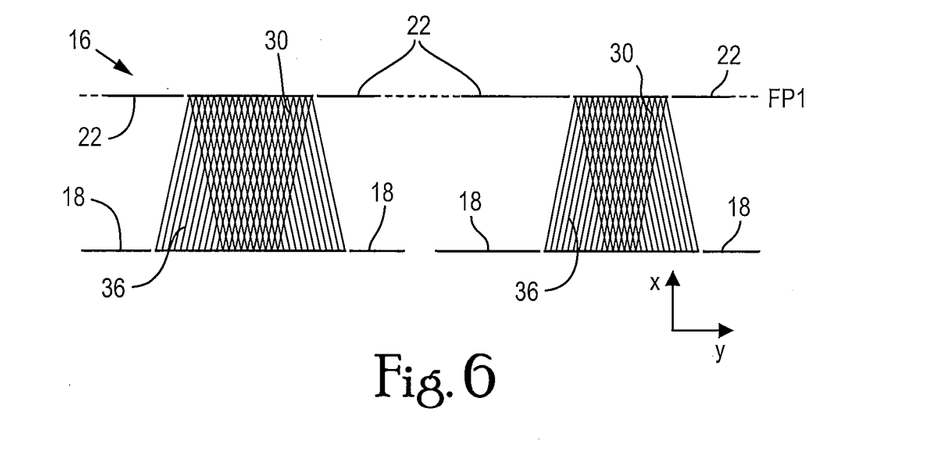
FIG. 6 shows an effect of using a uniformity correction system arranged according to an embodiment of the invention.

FIG. 6 shows an effect of using the embodiment of the invention of FIG. 5. FIG. 6 shows schematically in cross-section the uniformity correction system 16. The fingers 22 of the uniformity correction system are in the field plane FP1. In this plane, the radiation beam comprises an array of virtual sources 30. At the patterning device (e.g., reticle) masking blades 22, the radiation beam 36, which is represented by a plurality of sub-beams, is diverging.

In the left hand side of FIG. 6, the fingers 22 of the uniformity correction system 16 are positioned such that they do not intersect with the radiation beam 36. In right hand side of FIG. 6, the uniformity correction system fingers 22 have been moved in the y-direction such that they intersect with the radiation beam 36. Since the uniformity correction system 16 is located in the field plane FP1, the uniformity correction system does not introduce any asymmetry into the radiation beam. The radiation beam remains telecentric, and an asymmetric shadow is not introduced into the radiation beam in the integrated pupil plane. This allows the lithographic apparatus to project the pattern of the patterning device MA onto the substrate W with improved accuracy.

An alternative way of understanding the embodiment of the invention is to consider the virtual sources 26, 30 shown in FIGS. 4 and 6. In FIG. 4 when the fingers 22 intersect with the radiation beam, they cause some of the radiation which forms virtual sources 26 to be cut off. All of the virtual sources 26 remain, but those at the edge of the radiation beam do not receive radiation from all angles. Instead, they receive radiation from a subset of angles. These virtual sources are therefore no longer symmetric; asymmetry has been introduced into the pupil of the radiation beam.

In FIG. 6 when the fingers 22 intersect with the radiation beam, they cut off some of the virtual sources 30. However, since the fingers 22 are located in the field plane FP1 where the virtual sources are focused, the fingers do not partially cut off any of the virtual sources 30. The virtual sources 30 are either fully visible or fully cut off. The virtual sources 30 therefore remain symmetric, and the pupil of the radiation beam thus remains symmetric.

Another way of expressing the effect of the embodiment of the invention is that the pupil (angular distribution) of the radiation beam is the same at all locations in the field plane FP1. This means when fingers 22 of the uniformity correction system 16 cut off a part of the radiation beam, this does not affect the pupil (angular distribution) of the radiation beam. Asymmetry is therefore not introduced into the pupil of the radiation beam. The lithographic apparatus may thus project the pattern of the patterning device MA onto the substrate W with improved accuracy.

An advantage is that, because it does not cause asymmetry in the pupil of the radiation beam, the degree to which the uniformity correction system 16 may be used to correct non-uniformity in the radiation beam is increased significantly (i.e. the proportion of the radiation beam which may be cut off by the uniformity correction system 16).

The uniformity correction system 16 used by the embodiment may be of the type illustrated in FIG. 3. In that uniformity correction system 16, two sets of fingers 22 are provided, each set being on an opposite side of the illumination slit 23. One of the reasons that two sets of fingers 22 are provided is to reduce the amount of asymmetry introduced into the pupil of the radiation beam by the fingers 22.

Figure 7:
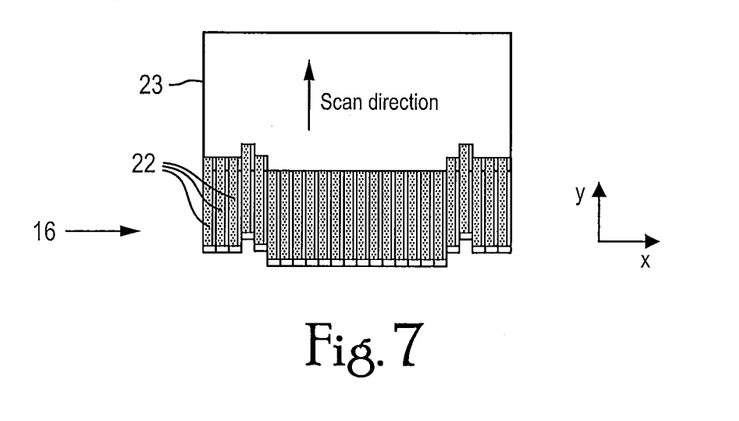
FIG. 7 depicts a uniformity correction system according to an embodiment of the invention.

An embodiment of the invention does not introduce asymmetry into the pupil of the radiation beam, for the reasons explained above. A uniformity correction system may be provided, as shown in FIG. 7, in which a single set of fingers 22 are present. The fingers 22 are moveable in the y-direction in the same manner as described above in relation to FIG. 3, thereby blocking part of the radiation beam and adjusting its intensity. Since the fingers 22 are located in the field plane FP1, they do not introduce asymmetry into the pupil of the radiation beam. A second set of fingers is therefore not required. The cost of providing the uniformity correction system 16 of FIG. 7 is less than the cost of providing the uniformity correction system of FIG. 3, since only a single set of fingers 120 is provided. In addition, the volume occupied by the uniformity correction system 16 is reduced, and thus the volume occupied by the illumination system IL may be reduced. This is advantageous because the cost of providing volume in a high specification clean room environment is considerable. Furthermore, in the case of a lithographic apparatus formed from reflective components (see, for example, FIG. 8), it may be undesirable to have a set of fingers on either side of the illumination slit.

As mentioned above, the masking blades 18 were located in the field plane FP1, which field plane FP1 is conjugate with the plane of the patterning device MA (which is conjugate with the plane of the substrate W). In the embodiment of the invention described above, the masking blades 18 are no longer located in the field plane FP1, since the uniformity correction system 16 is located in this plane. However, the masking blades 18 are still conjugate with the patterning device MA (and the patterning device MA is still conjugate with the substrate W). This means that the field plane FP1 of the lithographic apparatus of the embodiment of the invention is defocused with respect to the conjugate plane of the patterning device MA (and the conjugate plane of the substrate W). It is thus problematic to define the further field planes FP2, FP3, and these are therefore not shown in FIG. 5.

The nature in which planes of an optical system are defined makes it difficult to define the position of the uniformity correction system 16. The uniformity correction system 16 may be said to be located in a field plane (e.g. FP1) of the illumination system IL. Alternatively, the uniformity correction system may be said to be located in a plane which is illuminated with a constant pupil by the illumination system. That is to say, the angular distribution of radiation at each point across the plane of the uniformity correction system is the same. This is intended to be interpreted in a macroscopic way, for example in relation to telecentricity, energetic ellipticity, shape (in terms of sigma), shape ellipticity, and pole balance. It is not intended to mean that the intensity of radiation is the same at each point across the plane of the uniformity correction system.

In some instances the uniformity correction system may not be located precisely in a field plane (e.g. FP1) of the illumination system, but may, for example, be 1 millimeter or 2 millimeters or more away from it (less than 10 millimeters). This is expressed in this document by saying that the uniformity correction system is located substantially in the field plane. Equivalently it may be stated that the uniformity correction system is located in a plane which is illuminated with a substantially constant pupil by the illumination system.

It is desirable to keep the masking blades 18 close to the field plane FP1. The masking blades 18 may, for example, be located a few millimeters away from the field plane FP1. For example, the masking blades 18 may be less than 20 millimeters from the field plane FP1, may be less than 10 millimeters from the field plane FP1, and possibly less than 8 millimeters from the field plane FP1. The masking blades 18 may be located closer still to the field plane FP1, if the space occupied by the uniformity correction system 16 (and by the patterning device masking blades) is sufficiently thin to allow this to be achieved.

The fingers 22 of the uniformity correction system 16 may, for example, be 4 mm wide, and may be formed from silicon carbide. The fingers may be narrower than this, if construction methods allow this to be achieved. In general, narrower fingers allow finer correction of the uniformity of the radiation beam to be achieved.

Figure 8:
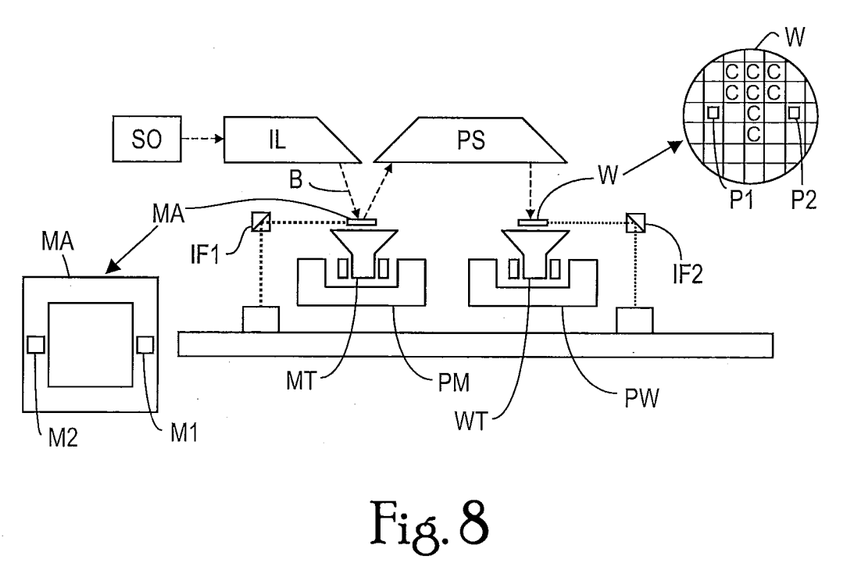
FIG. 8 depicts an alternative lithographic apparatus according to an embodiment of the invention.

FIG. 8 shows schematically a lithographic apparatus which comprises reflective components rather than the refractive components shown in FIG. 1. The purpose and operation of the components shown in FIG. 8 corresponds with those shown in FIG. 1, and so these will not be described here. The apparatus shown in FIG. 8 may be used, for example, when the source SO generates EUV radiation.

Figure 9:
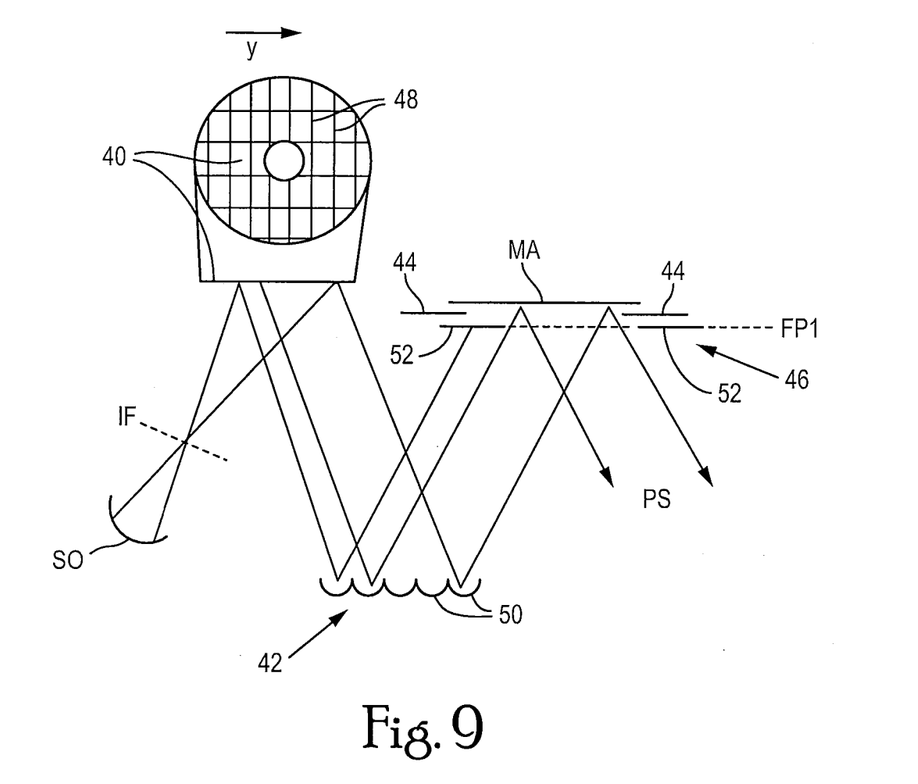
FIG. 9 depicts an alternative lithographic apparatus according to an embodiment of the invention.
Figure 10:
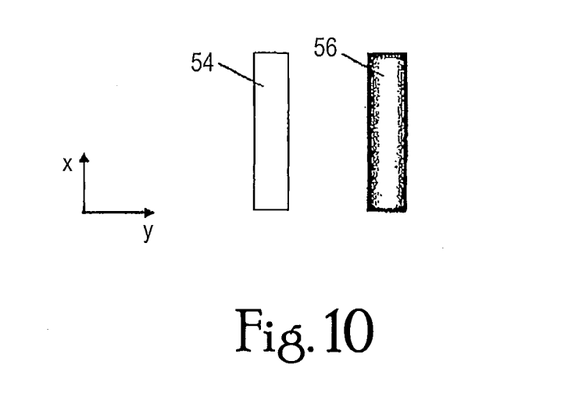
FIG. 10 depicts a field shape of a radiation beam of the lithographic apparatus.

When a lithographic apparatus of the type shown in FIG. 8 is used, an embodiment of the invention may be implemented using reflective components rather than refractive components. The embodiment of the invention is illustrated schematically in FIG. 9. The lithographic apparatus shown in FIG. 9 comprises a source SO configured to generate EUV radiation, a field facet mirror 40, a pupil facet mirror 42, and a support structure (not shown) holding a patterning device MA. A projection system, substrate table and associated substrate are not illustrated in FIG. 9. FIG. 9 shows patterning device (e.g., reticle) masking blades 44 and a uniformity correction system 46 of the lithographic apparatus.

The source SO is configured to generate EUV radiation as a converging beam which passes through an intermediate focus IF onto the field facet mirror 40. The field facet mirror 40 is also shown as viewed from above FIG. 9. The field facet mirror 40 comprises a plurality of reflective facets 48, each of which has the same dimension. Each facet 48 is arranged to form the radiation into a field which, when incident on the patterning device MA, has a desired shape and dimension. In practice many more facets 48 than are shown in FIG. 9 may be provided.

The radiation beam passes from the field facet mirror 40 to the pupil facet mirror 42, which comprises a plurality of concave reflective facets 50. Each concave facet 50 is arranged to receive radiation reflected from a different facet 48 of the field facet mirror 40. Therefore, the pupil facet mirror 42 has the same number of facets 50 (or more) as the field facet mirror 40. The pupil facet mirror 42 is arranged to direct the radiation beam onto the patterning device MA such that a single field is formed on the patterning device (the fields overlay one another). In addition to providing the desired field on the patterning device MA, the field facet mirror 40 and the pupil facet mirror 42 together apply a desired angular distribution to the radiation beam.

The radiation beam is patterned by the patterning device MA, and is directed towards the projection system (illustrated here as arrows moving towards the label PS).

The masking blades 44 are provided adjacent to the patterning device MA, for example a few millimeters from the patterning device. The uniformity correction system 46, which comprises two sets of fingers 52 (for example as shown in FIG. 3), is located adjacent to the patterning device, further away from the patterning device than the masking blades 44. The fingers 52 may, for example, be located 20 millimeters from the patterning device MA. Although two sets of fingers 52 are shown, as single set of fingers may be used instead (for example as shown in FIG. 7).

The pupil facet mirror 42 focuses the radiation at a focal plane FP1. The fingers 52 of the uniformity correction system 46 are located in this focal plane. For this reason, as explained further above, using the uniformity correction system 46 does not introduce any asymmetry into the pupil of the radiation beam. The radiation beam remains telecentric, and an asymmetric shadow is not introduced into the radiation beam in the integrated pupil plane. This allows the lithographic apparatus to project the pattern of the patterning device MA onto the substrate with improved accuracy.

Since the uniformity correction system 46 is located in the focal plane FP1, it follows that neither the masking blades 44 nor the patterning device MA are located in the focal plane. The field defined by the field facet mirror 40 is therefore defocused at the masking blades 44 and at the patterning device MA. As explained above, some defocusing at the masking blades 44 can be tolerated.

The amount of defocusing of the field at the patterning device MA which can be tolerated may depend upon the acceptance field of the projection system PS. Defocusing has the effect of reducing the size of the field defined by the field facet mirror 40, since only a reduced portion of the field will have a full intensity. This is illustrated schematically in FIG. 9, in which a field which suffers from some defocusing 56 is shown adjacent to a field 54 which does not suffer from defocusing. The light area of the defocused field 56 represents radiation at the desired full intensity. It can be seen that this area is smaller than the area of the focused field 54.

In order to compensate for the defocusing of the field at the patterning device MA, the size of the facets 48 in the field facet mirror 40 is increased in the x-direction (i.e. in the direction which is transverse to the direction of movement of the fingers of the uniformity correction system 46). The size is reduced in the y-direction (i.e. in the direction which is parallel to the direction of movement of the fingers of the uniformity correction system 46). The amount by which the size of the facets 48 of the field facet mirror 40 are reduced depends upon the amount of defocusing of the field at the patterning device MA, and on the size of the pupil of the projection system PS. For a given pupil, a greater degree of defocusing will require a greater reduction of the size of the facets 48 of the field facet mirror 40. The facets 48 are difficult to manufacture, and thus it may be undesirable to manufacture very small facets. Since the degree of defocusing is dependent upon the distance between the focal plane FP1 (i.e. the position of the uniformity correction system 46) and the patterning device MA, it is desired to locate the uniformity correction system as close to the patterning device as possible (so that the facets 48 of the field facet mirror 40 may be as large as possible, and thus easier to manufacture).

In an embodiment, it is desired that the focal plane FP1 (and the uniformity correction system 46) be less than 60 millimeters from the patterning device, desirably less than 40 millimeters from the patterning device MA, and desirably less than 20 millimeters from the patterning device. The focal plane FP1 (and the uniformity correction system 46) may, for example, be between 16 and 20 millimeters from the patterning device MA.

Although in the described embodiments the uniformity correction system is located in the field plane FP1, the uniformity correction system may be located in any suitable field plane.

In the described embodiments, the patterning device MA is described as in place. Manufacture and sale of lithographic apparatus is typically done without a patterning device MA being in place. References to the location of the patterning device may therefore be interpreted as referring to the location where a patterning device is intended to be provided during use of the lithographic apparatus. If the patterning device is a mirror array (or equivalent), then the patterning device is likely to be present during manufacture and sale of the lithographic apparatus.

References to the field plane of the radiation beam may be interpreted as referring to the field plane of the illumination system (for example in the event that the lithographic apparatus is not operating and no radiation beam is therefore present).

Although in the described embodiments of the invention the uniformity correction system is located in the field plane, the uniformity correction system may be located adjacent to (but not in) the field plane. The patterning device masking blades are also not located in the field plane. Where this is done, the uniformity correction system is located closer to the field plane than would have been the case if the patterning device masking blades were to be located in or at the field plane. This provides a reduction of the asymmetry introduced in the pupil plane of the radiation beam by the uniformity correction system.

While specific embodiments of the invention have been described above, it will be appreciated that the invention may be practiced otherwise than as described. The description is not intended to limit the invention.

The invention claimed is:

1. A lithographic apparatus comprising:
    an illumination system configured to condition a beam of radiation, the illumination system comprising a uniformity correction system located in a plane which, in use, is illuminated with a substantially constant pupil by the illumination system;
    a support structure configured to hold a patterning device, the patterning device configured to impart the radiation beam with a pattern in its cross-section;
    a patterning device masking blade located adjacent to the uniformity correction system, the patterning device masking blade not illuminated with a constant pupil by the illumination system;
    a substrate table configured to hold a substrate; and
    a projection system configured to project the patterned radiation beam onto a target portion of the substrate.

2. The lithographic apparatus of claim 1, wherein the uniformity correction system is located in a plane which, in use, is illuminated with a constant pupil by the illumination system.

3. The lithographic apparatus of claim 1, wherein the uniformity correction system is located in a focal plane of a field lens group of the illumination system.

4. The lithographic apparatus of claim 1, wherein the uniformity correction system comprises a plurality of fingers which are movable into and out of intersection with the radiation beam.

5. The lithographic apparatus of claim 4, wherein the plurality of fingers are located on only one side of the radiation beam.

6. The lithographic apparatus of claim 1, comprising transmissive optics in the illumination system and projection system.

7. The lithographic apparatus of claim 1, wherein the patterning device masking blade is located less than 20 millimeters from a field plane of the illumination system.

8. The lithographic apparatus of claim 7, wherein the patterning device masking blade is located less than 10 millimeters from the field plane.

9. The lithographic apparatus of claim 1, wherein the illumination system and projection system comprises reflective optics.

10. The lithographic apparatus of claim 9, wherein the uniformity correction system is located adjacent to the patterning device support structure such that, in use, the patterning device is separated from a field plane of the lithographic apparatus.

11. The lithographic apparatus of claim 10, further comprising a field facet mirror, facets of the field facet mirror having a dimension such that, taking into account defocusing arising due to the separation between the patterning device and the field plane, the field of the radiation beam falls within the acceptance field of the projection system.

12. The lithographic apparatus of claim 11, wherein the field plane comprises a plane in which an image of facets of the field facet mirror are formed in use.

13. The lithographic apparatus of claim 10, wherein the uniformity correction system is located less than 60 millimeters from the location at which the patterning device will be held by the patterning device support structure in use.

14. The lithographic apparatus of claim 13, wherein the uniformity correction system is located less than 40 millimeters from the location at which the patterning device will be held by the patterning device support structure in use.

15. The lithographic apparatus of claim 14, wherein the uniformity correction system is located less than 20 millimeters from the location at which the patterning device will be held by the patterning device support structure in use.

16. A lithographic apparatus comprising:
    an illumination system configured to condition a beam of radiation;
    a support structure configured to hold a patterning device, the patterning device configured to impart the radiation beam with a pattern in its cross-section;
    a uniformity correction system configured to adjust an intensity of the radiation beam, the uniformity correction system located at or adjacent to a field plane of the illumination system;
    a patterning device masking blade configured to mask at least a portion of the radiation beam, the patterning device masking blade not located in the field plane of the illumination system or an optically conjugate plane thereof;
    a substrate table configured to hold a substrate; and
    a projection system configured to project the patterned radiation beam onto a target portion of the substrate.

17. The lithographic apparatus of claim 16, wherein the patterning device masking blade is located less than 20 millimeters from the field plane of the illumination system or an optically conjugate plane thereof.

18. The lithographic apparatus of claim 16, wherein the patterning device masking blade is optically conjugate with the patterning device.

19. A method of lithography comprising:
    generating a radiation beam;
    passing the radiation beam through an illumination system of a lithographic apparatus;
    directing the radiation beam onto a patterning device to pattern the radiation beam;
    projecting the patterned radiation beam through a projection system of the lithographic apparatus and onto a substrate, wherein an intensity of the radiation beam is adjusted by a uniformity correction system which is illuminated with a substantially constant pupil by the illumination system, and at least a portion of the radiation beam is masked by a patterning device masking blade located adjacent to the uniformity correction system, the patterning device masking blade not illuminated with a constant pupil by the illumination system.

20. The method of claim 19, wherein the uniformity correction system is illuminated with a constant pupil by the illumination system.

21. The method of claim 19, wherein the patterning device masking blade is located less than 20 millimeters from the field plane of the illumination system or an optically conjugate plane thereof.

22. The lithographic apparatus of claim 1, wherein the patterning device masking blade is optically conjugate with the patterning device.

23. The method of claim 19, wherein the patterning device masking blade is optically conjugate with the patterning device.

* * * * *

UNITED STATES PATENT AND TRADEMARK OFFICE
CERTIFICATE OF CORRECTION

PATENT NO. : 8,441,611 B2
APPLICATION NO. : 12/292767
DATED : May 14, 2013
INVENTOR(S) : Hendrikus Robertus Marie Van Greevenbroek Page 1 of 1

It is certified that error appears in the above-identified patent and that said Letters Patent is hereby corrected as shown below:

On title page, after Item (65) Prior Publication Data,
add the following priority section:
--Item (60) Related U.S. Application Data, Provisional application No. 60/996,653, filed on Nov. 28, 2007.--

Signed and Sealed this
Seventeenth Day of September, 2013

Teresa Stanek Rea
*Deputy Director of the United States Patent and Trademark Office*